(12) United States Patent
Park et al.

(10) Patent No.: US 6,687,125 B2
(45) Date of Patent: Feb. 3, 2004

(54) COOLING SYSTEM FOR INTEGRATED CIRCUIT CHIP

(75) Inventors: Jung-Sik Park, Seoul (KR); Eon-Pyo Hong, Seoul (KR); Yong-Dol Park, Gyeonggi-Do (KR); Dong-Koo Shin, Gyeonggi-Do (KR); Jin-Young Jung, Seoul (KR); Hyeong-Kook Lee, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/183,375

(22) Filed: Jun. 28, 2002

(65) Prior Publication Data

US 2003/0174468 A1 Sep. 18, 2003

(30) Foreign Application Priority Data

Mar. 14, 2002 (KR) ........................................ 2002/13931

(51) Int. Cl.[7] ................................................. H05K 7/20
(52) U.S. Cl. .................. 361/700; 62/259.2; 165/104.33; 257/715
(58) Field of Search ........................ 62/259.2; 165/80.3, 165/80.4, 185, 104.33; 257/714, 715; 361/687, 699, 700, 715, 717–719

(56) References Cited

U.S. PATENT DOCUMENTS

| | | | |
|---|---|---|---|
| 4,729,424 A | * | 3/1988 | Mizuno et al. |
| 5,052,472 A | * | 10/1991 | Takahashi et al. ........... 165/299 |
| 5,323,847 A | * | 6/1994 | Koizumi et al. ........ 165/104.33 |
| 6,205,796 B1 | * | 3/2001 | Chu et al. ....................... 62/94 |

OTHER PUBLICATIONS

USPGPUB 2002/0023453 A1, filed Feb. 28, 2002, Davidson et al.*

USPGPUB 2003/0019235 A1, filed Jan. 30, 2003, Wall et al.*

* cited by examiner

Primary Examiner—G P Tolin
(74) Attorney, Agent, or Firm—Fleshner & Kim, LLP

(57) ABSTRACT

In a cooling system for an integrated circuit chip, by including an evaporator contacted-combined with an integrated circuit chip installed onto a board and absorbing heat generated at the integrated circuit chip; a compressor connected to the evaporator by a first connection pipe; a condenser connected to the compressor by a second connection pipe; an expansion means connected to the condenser by a third connection pipe and simultaneously connected to the evaporator by a fourth connection pipe; and a mounting board installed onto the board by a board combining means and mounted with the compressor, the condenser and the expansion means, it is possible to perform the operation of the integrated circuit chip smoothly, and accordingly a reliability of a product can be improved. In addition, although an integrated circuit chip is getting even more integrated, cooling of the integrated circuit chip can be efficiently performed.

19 Claims, 4 Drawing Sheets

US 6,687,125 B2

COOLING SYSTEM FOR INTEGRATED CIRCUIT CHIP

BACKGROUND OF THE INVENTION

1. Field of the Invention

The present invention relates to a cooling system for an integrated circuit chip, and in particular to a cooling system for an integrated circuit chip which is capable of efficiently cooling heat generated at an integrated circuit chip.

2. Description of the Prior Art

Generally, a computer includes an input unit for inputting information, namely, data, a CPU (central processing unit) for processing data inputted through the input unit and an output unit for outputting data processed by the CPU, when a user inputs data through the input unit, the inputted data is processed by the CPU and is outputted through the output unit.

An input unit of a computer includes a keyboard, a mark reader, an optical character reader and an audio input unit, etc., and an output unit of a computer includes a monitor and a printer, etc.

Particularly, a main body of a computer consists of a main board mounted with plural integrated circuit chips such as a CPU, etc. and additional electronic parts; connection parts for transmitting/receiving signals with a hard disk as one of a storing unit, the main board and an input/output units; and a casing for receiving the main board, the hard disk and the connection parts, etc.

In addition, inside the casing of the main body, a power supply for supplying power is installed, and a cooling unit for radiating and cooling heat generated at the main board, the hard disk and the power supply, etc. placed inside the casing is installed.

FIG. 1 is a schematic perspective view illustrating a general computer, and FIG. 2 is a sectional view illustrating a cooling unit for cooling a CPU of the computer shown in FIG. 1.

In the meantime, in the operation of the computer, heat is generated at the main board, the hard disk and the power supply, etc., in order to operate the computer stably, heat generated in the main body of the computer has to be efficiently cooled.

As depicted in FIG. 1, in order to cool heat generated in the main body of the computer, a heat sink 40 is installed at a certain side of a main board 30 at which a CPU 20 is installed, and a fan assembly 50 for generating air flow is installed along with the heat sink 40.

The heat sink 40 includes a contact surface 41 contacted to the CPU 20 of the main board 30 and plural radiation pins 42 perpendicularly extended from the contact surface 41 so as to have a certain thickness and area, and the fan assembly 50 includes a fan 52 and a fan motor 53 installed inside a fan housing 51. The heat sink 40 is combined with the fan assembly 50 by the plural radiation pins 42 and plural bolts 60.

When power is applied to the computer and the computer operates, high temperature heat is generated in the CPU 20 of the main board 30, the heat generated in the CPU 20 is transmitted through the heat sink 40.

Simultaneously, the fan assembly 50 installed at the heat sink 40 operates and generates air flow, by the air flow generated by the fan assembly 50, outer air flows in through blast ports (not shown) formed at a certain side of the casing 10, the heat transmitted to the heat sink 40 is radiated, and accordingly the CPU 20 of the main board 30 is cooled.

However, in the conventional computer cooling unit, there are limitations in cooling capacity and cooling speed, in addition, because the CPU 20 is cooled by the air flow, impurities may penetrate the casing 10, it may cause failure of internal parts, in addition, noise may occur due to the operation of the fan assembly 50.

In particular, with the development of information society, data processing speed of an integrated circuit chip such as a CPU, etc. has been rapidly improved, its data processing capacity has been remarkably increased/integrated, also capacity of additional construction parts has been improved, and accordingly an amount of heat generated in the operation of the computer has been greatly increased.

Because of those reasons, in a general cooling system using a fan assembly to cool an integrated circuit chip, it is impossible to cool sufficiently lots of heat generated in the integrated circuit chip, and accordingly wrong operation or a failure of the integrated circuit chip may occur due to over heat.

SUMMARY OF THE INVENTION

In order to solve the above-mentioned problems, it is an object of the present invention to provide a cooling system for an integrated circuit chip which is capable of efficiently cooling lots of heat generated in an integrated circuit chip.

In order to achieve the above-mentioned object, it is an object of the present invention to provide a cooling system for an integrated circuit chip including an evaporator contacted-combined with an integrated circuit chip installed onto a board and absorbing heat generated at the integrated circuit chip; a compressor connected to the evaporator by a first connection pipe; a condenser connected to the compressor by a second connection pipe; an expansion means connected to the condenser by a third connection pipe and simultaneously connected to the evaporator by a fourth connection pipe; and a mounting board installed onto the board by a board combining means and mounted with the compressor, the condenser and the expansion means.

In addition, it is another object of the present invention to provide a cooling system for an integrated circuit chip including an evaporator contacted-combined with an integrated circuit chip installed onto a board fixed to a frame and absorbing heat generated at the integrated circuit chip; a compressor connected to the evaporator by a first connection pipe; a condenser connected to the compressor by a second connection pipe; an expansion means connected to the condenser by a third connection pipe and simultaneously connected to the evaporator by a fourth connection pipe; and a mounting board installed at the frame by a board combining means and mounted with the compressor, the condenser and the expansion means.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
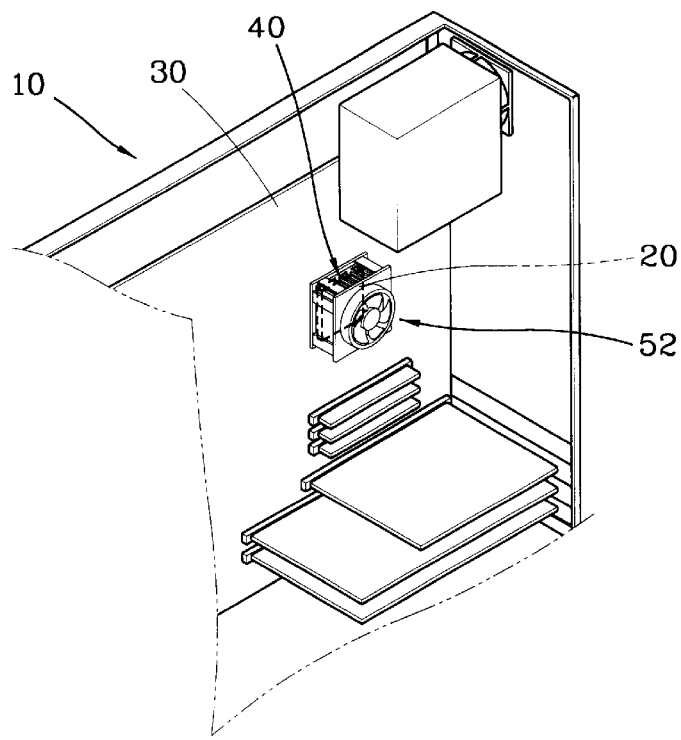
FIG. 1 is a schematic perspective view illustrating a general computer.
Figure 2:
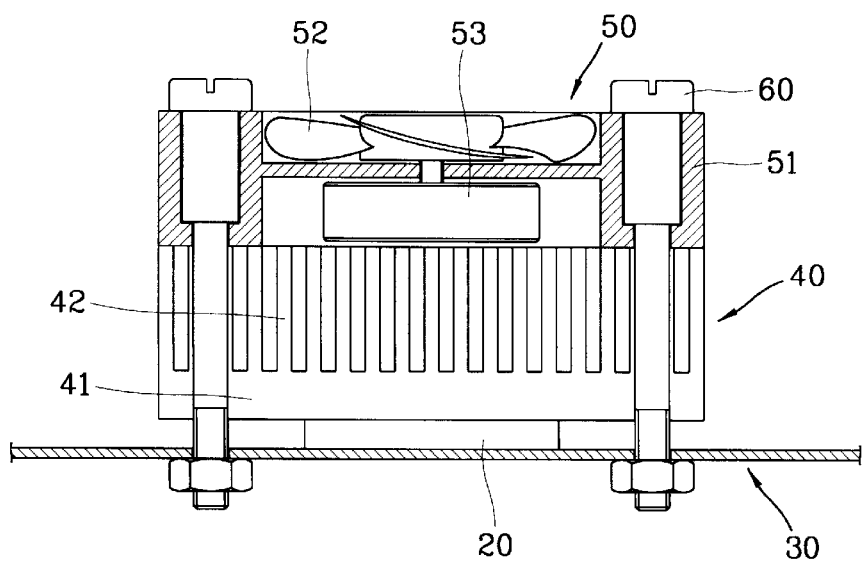
FIG. 2 is a sectional view illustrating a cooling unit of the computer shown in FIG. 1.
Figure 3:
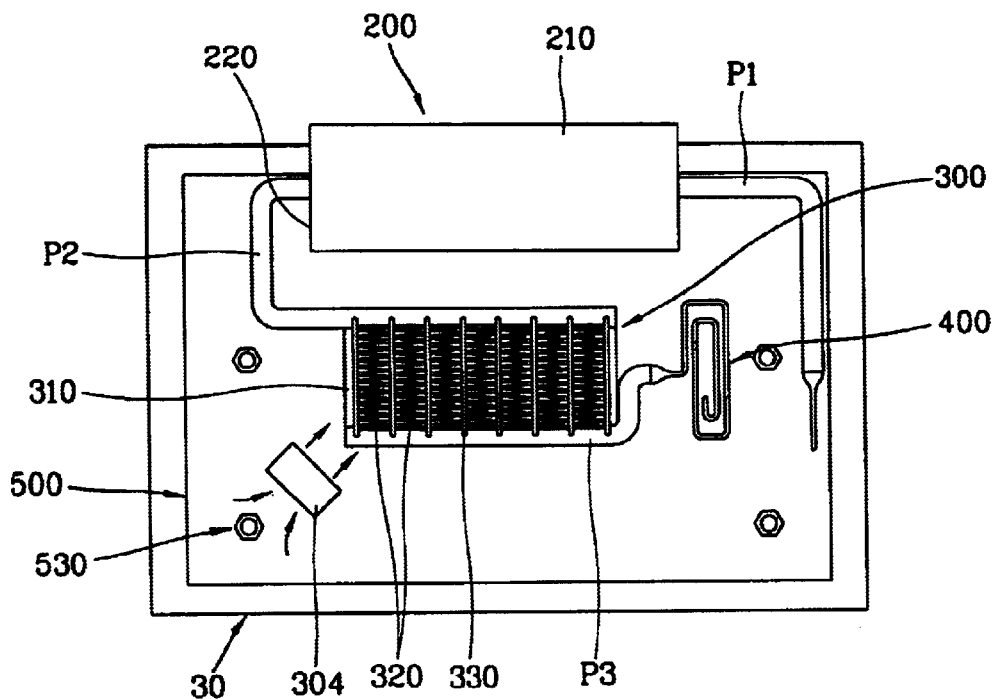
FIG. 3 is a plan view illustrating a cooling system for an integrated circuit chip in accordance with the present invention.
Figure 4:
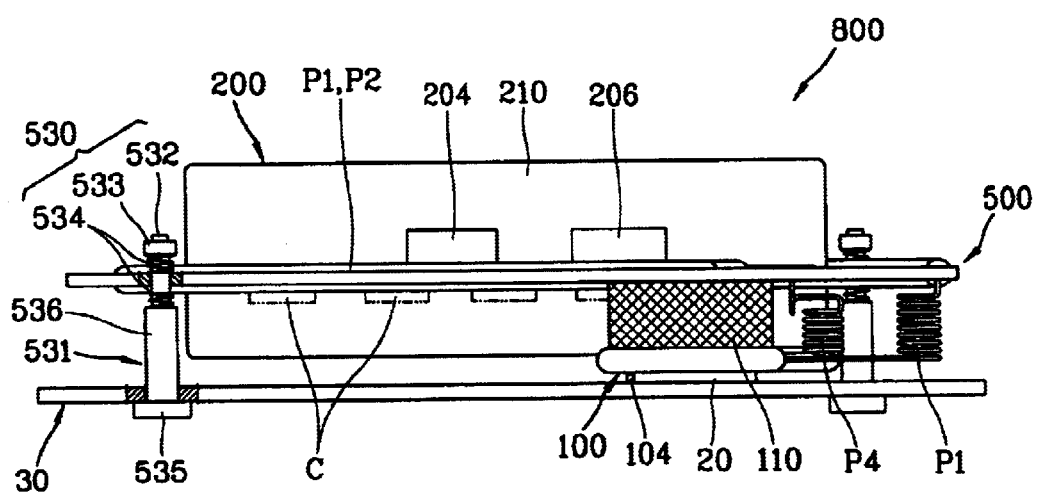
FIG. 4 is a front view illustrating the cooling system in FIG. 3.
Figure 5:
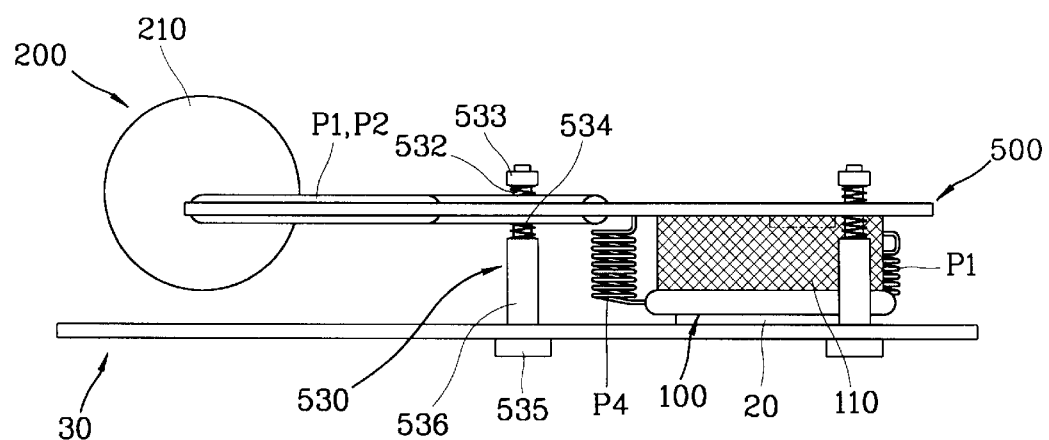
FIG. 5 is a side view illustrating the cooling system in FIG. 3.

Hereinafter, a cooling system for an integrated circuit chip in accordance with the present invention will be described in detail with reference to accompanying drawings.

As depicted in FIGS. 3~6, the cooling system for the integrated circuit chip in accordance with the present invention includes an evaporator 100 contacted-combined with an integrated circuit chip 20 installed onto a board 30 and absorbing heat generated in the integrated circuit chip 20, a compressor 200 connected to the evaporator 100 by a first connection pipe P1, a condenser 300 connected to the compressor 200 by a second connection pipe P2, an expansion means 400 connected to the condenser 300 by a third connection pipe P3 and connected to the evaporator 100 by a forth connection pipe P4, and a mounting board 500 installed onto the board 30 by a board combining means 530 and mounted with the compressor 200, the condenser 300 and the expansion means 400.

The integrated circuit chip 20 is a CPU. However, the present invention can be applied to all kinds of integrated circuit chip generating heat not less than a certain standard.

The board 30 is placed inside the casing 10, and additional required parts are installed inside the casing.

The mounting board 500 is combined with the board 30 by a board combining means 530 so as to have a certain distance from the board 30 in order to make the compressor 200 installed at the mounting board 500 not to contact to the board 30.

In addition, in the mounting board 500, because an upper plate and a lower plate having a certain area are closely contacted each other, it has a flat board shape, and a power connection means (not shown) for the operation of the compressor 200 and a control unit 600 and additional required circuit, etc. are mounted onto.

The board combining means 530 includes a fixed bolt 531 inserted into a through hole 540 formed at the mounting board 500, a fixed nut 533 fastened to a screw portion 532 of the fixed bolt 531, and plural springs 534 inserted into the screw portion 532 from both the upper and the bottom portions of the mounting board 500.

The springs 534 are placed at both the upper and the bottom portions of the mounting board 500 and elastically supports the mounting board 500.

The fixed bolt 532 consists of a bolt head portion 535, a body portion 536 extended from the bolt head portion 535 as a circular rod shape, and a spiral portion 532 extended from the body portion 536 so as to have the outer diameter smaller than that of the body portion 536 and formed a spiral shape at the outer circumference.

The fixed bolt 531 is inserted into the circuit board of the board 30, herein, the bolt head portion 535 hangs on the circuit board, and the screw portion 532 is inserted into the through hole 540 of the mounting board 500.

Herein, the two springs 534 are inserted between the screw portion 532 of the fixed bolt 531 and the mounting board 500.

The two springs 534 are inserted into the screw portion 532 of the fixed bolt 531, the fixed nut 533 is fastened to the screw portion 532, and accordingly the mounting board 500 is elastically supported by the two springs 534.

The evaporator 100 is contacted to the integrated circuit chip 20 and uses a flat type heat exchanger having an internal coolant path.

In addition, except a portion contacted to the integrated circuit chip 20, the upper or the external surface of the evaporator 100 is covered with a heat insulation member 110 in order to minimize heat loss and prevent vibration and heat transmission to the mounting board. Herein, the heat insulation member 100 is an elastic plate having a certain thickness and area.

In the first connection pipe P1 connecting the evaporator 100 to the compressor 200 and the fourth connection pipe P4 connecting the evaporator 100 to the expansion means 400, a certain portions thereof are made of a flexible material to absorb vibration, and they have a coil shape.

The first and the fourth connection pipes P1, P4 respectively have a coil portion having the outer diameter smaller than that of other portions, herein, it is preferable to wind the coil portion as a coil shape.

The first connection pipe P1 penetrates through the mounting board 500 and connects the compressor 200 with the evaporator 100, herein, it is preferable to place some part of the first connection pipe P1 inside the mounting board 500.

The compressor 200 is fixedly combined with the mounting board 500 by being received-combined with a compressor receiving portion 220 formed at a certain side of the mounting board 500. Herein, the compressor receiving portion 220 has an open shape at a certain side of the mounting board 500.

Various types of compressor can be used as the compressor 200 in the present invention, in the present embodiment, the compressor 200 including a compression operating part (not shown) having a pair of linear motors 204 and 206 received in a compressor casing 210 and a compression part (not shown) compressing a coolant by the operation of the compression operating part is used.

Particularly, when the pair of linear motors are arranged so as to face each other, some of vibration occurred in the operation of the linear motor can be compensated.

And, the compressor 200 is connected to the condenser 300 for condensing the coolant compressed in the compressor 200 by the second connection pipe P2.

The condenser 300 includes plural coolant paths 320 connecting the second connection pipe P2 to the third connection pipe P3 and the plural radiation pins 330 combined with the coolant paths 320, and it is received-combined with a condenser receiving portion 310 having an open shape and formed inside the mounting board 500. Herein, in order to make the condenser 300 perform heat exchange with outer air smoothly a fan 304 for generating air flow can be installed at an appropriate portion.

The expansion means 400 is connected to the condenser 300 through the third connection pipe P3 and has a capillary tube.

In the meantime, the condenser 300, the expansion means 400, the second and the third connection pipes P2, P3 construct one-bodied assembly 800 with the mounting board 500.

In more detail, in the one-bodied assembly 800, the second connection pipe P2 connecting the compressor 200 with the condenser, the condenser 300, the third connection pipe P3 connecting the condenser 300 with the expansion means 400 and the expansion means 400 are installed inside the mounting board 500 as one-body.

Figure 6:
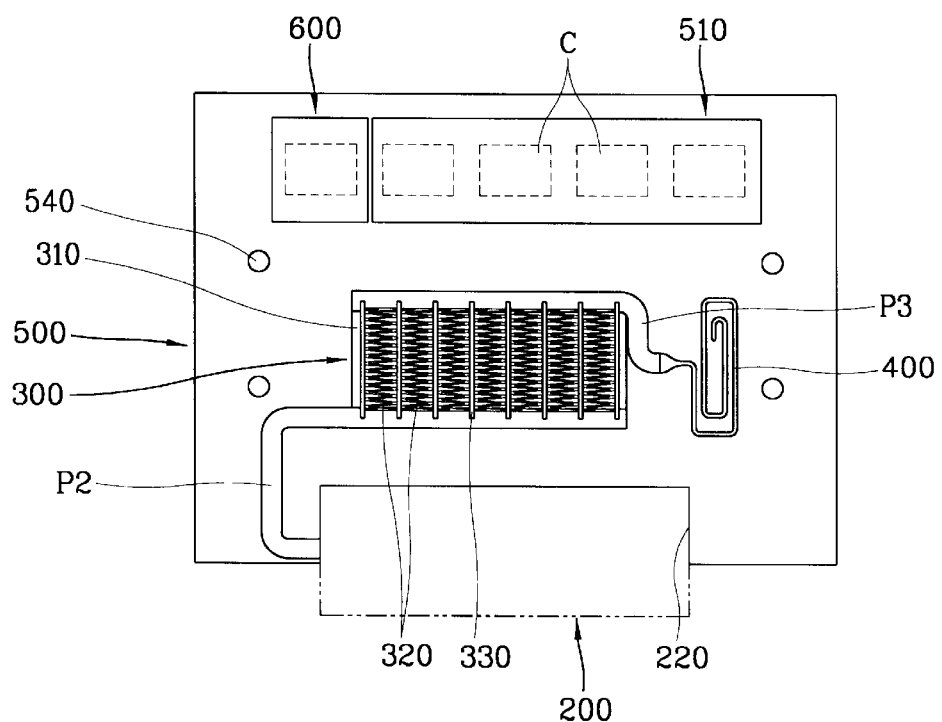
FIG. 6 is a rear view illustrating a mounting board of the cooling system in FIG. 3.

In the meantime, as depicted in FIG. 6, in the cooling system for the integrated circuit chip in accordance with the embodiment of the present invention, a chip mounting unit 510 for mounting chips C is installed at a certain side of the is mounting board 500, and it has a certain insulated area at the certain side of the mounting board 500.

In addition, it is preferable for a height of the one-bodied assembly 800 including the mounting board 500, the compressor 200, the condenser 300, the expansion means 400 and the evaporator 100, etc. to be within 40 mm from the upper surface of the board 30.

In addition, in the cooling system for the integrated circuit chip in accordance with the embodiment of the present invention, the control unit 600 for controlling the cooling system can be installed at the board 30 or the mounting board 500.

The control unit 600 controls the cooling system to make a surface temperature of the integrated circuit chip 20 place within a preset temperature range according to a temperature measured by a temperature sensor 104 installed at the integrated circuit chip 20. Herein, the preset temperature range can be determined through tests within a range in which the integrated circuit chip 20 smoothly operates.

In the meantime, in the cooling system for the integrated circuit chip in accordance with the embodiment of the present invention, the compressor 200 causes lots of vibration in the operation.

Figure 7:
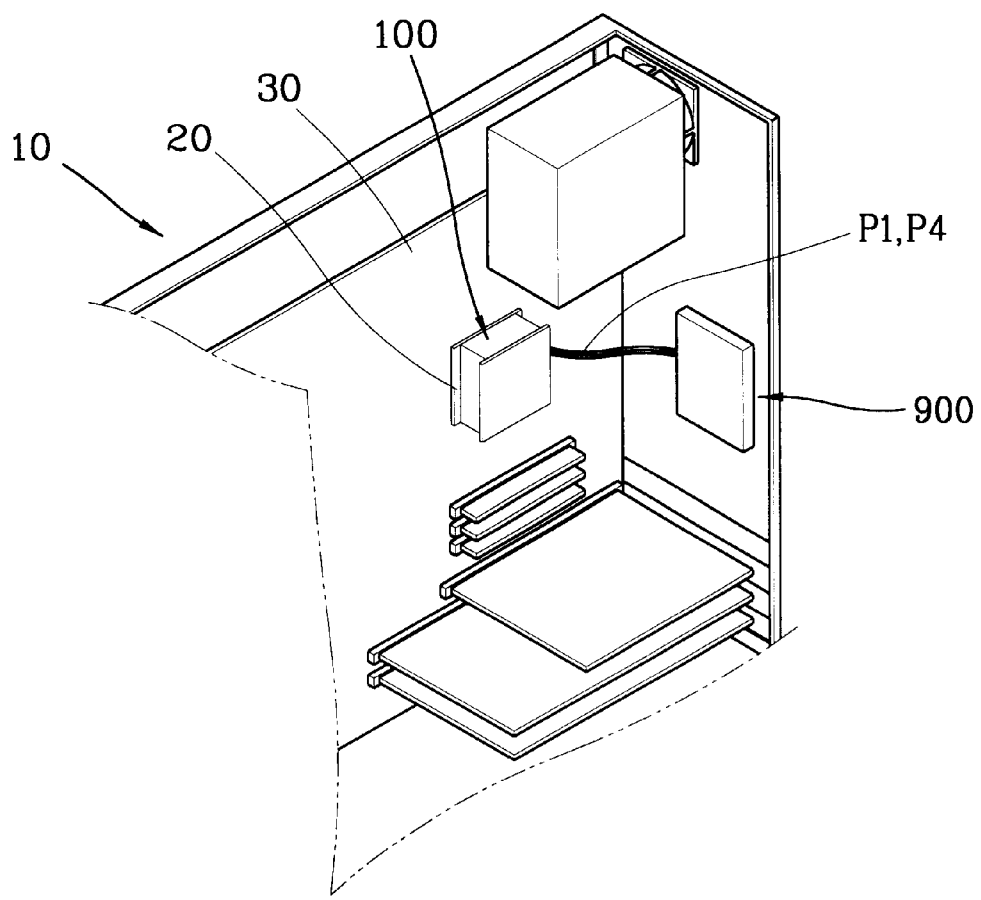
FIG. 7 is a perspective view illustrating another embodiment of a cooling system for an integrated circuit chip in accordance with the present invention.

Accordingly, a cooling system for an integrated circuit chip in accordance with another embodiment of the present invention is provided. In another embodiment, as shown in FIG. 7, a one-bodied assembly 900 consisting of the compressor 200, the condenser 300, the expansion means 400, the second and the third connection pipes P2, P3 except the evaporator 100 is installed at the internal wall of the casing 10 at which the board 30 is installed.

Herein, the one-bodied assembly 900 has the same structure as the one-bodied assembly 800. In more detail, the evaporator 100 and the compressor 200 are connected by the first connection pipe P1, the evaporator 100 and the expansion means 400 are connected by the fourth connection pipe P4, and the first and the fourth connection pipes P1, P4 are made of materials having flexibility in order to absorb vibration of the compressor 200.

Hereinafter, the operation of the cooling system for the integrated circuit chip in accordance with another embodiment of the present invention will be described in detail.

First, by applying power, the integrated circuit chip 20 operates, and lots of heat is generated at the integrated circuit chip 20 installed onto the board 30.

Simultaneously with the operation of the integrated circuit chip 20, power is applied to the compressor 200, the compressor 200 operates, a high temperature-high pressure coolant compressed in the compressor 200 is converted into a low temperature-low pressure coolant while passing the condenser 300 and the expansion means 400, the coolant flows in the evaporator 100, evaporates in the evaporator 100 and flows in the compressor 200, and the above-described processes are repeated. Herein, while the coolant evaporates in the evaporator 100, outer heat is absorbed.

In more detail, the evaporator 100 absorbs high temperature heat generated at the integrated circuit chip 20, and accordingly the integrated circuit chip 20 is cooled.

And, by controlling the operation of the compressor according to the control of the control unit 600, a heat quantity absorbed by the evaporator 100 and a cooling speed can be adjusted so as to place a temperature of the integrated circuit chip 20 within a preset temperature range.

In the present invention, while the coolant evaporates in the evaporator 100 constructing the cooling cycle system, because heat generated in the integrated circuit chip 20 contacted to the evaporator 100 is absorbed, the integrated circuit chip 20 is cooled, and accordingly the operation of the integrated circuit chip 20 can be performed smoothly.

Particularly, according to the technology developments of an integrated circuit chip such as a CPU, an integrated circuit chip has been highly integrated and a processing speed has been remarkably improved. Because of that, an integrated circuit chip may generate lots of heat in the operation, even though, in the present invention, the lots of heat generated in the integrated circuit chip can be sufficiently absorbed, and accordingly the operation of the integrated circuit chip can be smoothly performed.

In addition, unlike the conventional art, in the present invention, by absorbing heat generated in the integrated circuit chip without forming outer air inflow to cool the integrated circuit chip, the integrated circuit chip can be efficiently cooled, simultaneously outer impurities penetration can be minimized.

In addition, in the present invention, a pair of linear motors face each other, a coolant is compressed by a linear reciprocating driving force, vibration occurred in the coolant compressing can be compensated, and accordingly vibration transmitted to outside can be minimized.

In addition, by forming the connection pipes P1, P4 connected to the evaporator 100 as a coil shape, combining the heat insulation member 150 for preventing vibration transmission with the evaporator 100, and installing the spring 100 at the board combining means for connecting the board 30 with the mounting board 70 in order to elastically support the mounting board 70, vibration transmission to the integrated circuit chip 20 of the board 30 through the evaporator 100 can be minimized.

In addition, by forming the outer diameter of the compressor 220 smaller and the outer diameter of an assembly of construction parts within 40 mm, a total size and an installation space can be reduced, and accordingly it can be easily installed in a small space.

The present invention can be applied to various equipment using an integrated circuit chip generating lots of heat such as a computer, an electronic appliance, etc.

As described above, in the cooling system for the integrated circuit chip in accordance with the present invention, by absorbing high-temperature heat generated at an integrated circuit chip in the operation by using an evaporator, the integrated circuit chip can be sufficiently cooled and smoothly operated, and accordingly a reliability of a product can be improved. In addition, if an integrated circuit chip is getting integrated even more, it is possible to cool the integrated circuit chip actively.

What is claimed is:

1. A cooling system for an integrated circuit chip, comprising:

an evaporator contacted-combined with an integrated circuit chip installed onto a board and absorbing heat generated at the integrated circuit chip;

a compressor connected to the evaporator by a first connection pipe;

a condenser connected to the compressor by a second connection pipe;

an expansion means connected to the condenser by a third connection pipe and simultaneously connected to the evaporator by a fourth connection pipe; and a mounting board installed onto the board by a board combining means and mounted with the compressor, the condenser and the expansion means.

2. The system of claim 1, wherein the compressor is received-combined with a compressor receiving portion formed at a certain side of the mounting board, the condenser is received-combined with a condenser receiving portion formed inside the mounting board, the expansion means is installed inside the mounting board, the second and the third connection pipes are installed inside the mounting board.

3. The system of claim 2, wherein the condenser receiving portion is an open portion formed inside the mounting board.

4. The system of claim 2, wherein the condenser includes plural coolant paths connecting the second connection pipe to the third connection pipe and plural radiation pins combined with the plural coolant paths.

5. The system of claim 2, wherein the expansion means is a capillary tube.

6. The system of claim 1, further comprising:

a control means for controlling a temperature of the integrated circuit chip within a preset temperature range.

7. The system of claim 6, wherein the control means is installed onto the mounting board.

8. The system of claim 1, wherein a driving unit of the compressor is a linear motor.

9. The system of claim 1, wherein a driving unit of the compressor is a pair of linear motors placed so as to face each other.

10. The system of claim 1, wherein the board combining means elastically supports the mounting board to absorb vibration of the compressor.

11. The system of claim 1, wherein the compressor is received-combined with a compressor receiving portion formed at the mounting board.

12. The system of claim 11, wherein the compressor receiving portion is formed at a certain side of the mounting board.

13. The system of claim 1, wherein the first connection pipe and the fourth connection pipe connected to the evaporator are made of flexible materials to absorb vibration occurred at the compressor.

14. The system of claim 13, wherein the first connection pipe and the fourth connection pipe have a coil shape.

15. The system of claim 1, wherein the evaporator is placed at the upper portion of the integrated circuit chip, and the mounting board is placed at the upper portion of the evaporator.

16. The system of claim 1, wherein the evaporator is a flat type heat exchanger having a flow path in which a coolant flows.

17. The system of claim 1, wherein the evaporator is covered with a heat insulation member except a portion at which the integrated circuit chip is contacted.

18. The system of claim 1, wherein the condenser includes:

plural coolant paths connecting the second connection pipe to the third connection pipe;

a heat exchanger having plural radiation pins combined with the plural coolant paths; and a fan installed onto the mounting board and generating air flow around the heat exchanger.

19. A cooling system for an integrated circuit chip, comprising:

an evaporator contacted-combined with an integrated circuit chip installed onto a board fixed to a frame and absorbing heat generated at the integrated circuit chip;

a compressor connected to the evaporator by a first connection pipe;

a condenser connected to the compressor by a second connection pipe;

an expansion means connected to the condenser by a third connection pipe and simultaneously connected to the evaporator by a fourth connection pipe; and a mounting board installed at the frame by a board combining means and mounted with the compressor, the condenser and the expansion means.

* * * * *